United States Patent
Chen et al.

(10) Patent No.: US 9,542,268 B2
(45) Date of Patent: Jan. 10, 2017

(54) DYNAMIC DATA DENSITY ECC

(71) Applicant: Macronix International Co., Ltd., Hsinchu (TW)

(72) Inventors: Chung-Kuang Chen, Hsinchu (TW); Han-Sung Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 77 days.

(21) Appl. No.: 14/167,927

(22) Filed: Jan. 29, 2014

(65) Prior Publication Data

US 2015/0212875 A1    Jul. 30, 2015

(51) Int. Cl.
| | | |
|---|---|---|
| *H03M 13/00* | (2006.01) | |
| *H03M 13/11* | (2006.01) | |
| *G06F 11/10* | (2006.01) | |
| *H03M 13/15* | (2006.01) | |
| *H03M 13/35* | (2006.01) | |

(52) U.S. Cl.
CPC ........ *G06F 11/1048* (2013.01); *H03M 13/151* (2013.01); *H03M 13/356* (2013.01); *H03M 13/6505* (2013.01); *H03M 13/6561* (2013.01)

(58) Field of Classification Search
CPC . G06F 11/1048; G06F 11/10; H03M 13/6561; H03M 13/151; H03M 13/6505; H03M 13/356; H03M 13/11; H03M 13/6566
See application file for complete search history.

(56) References Cited

U.S. PATENT DOCUMENTS

| | | | | |
|---|---|---|---|---|
| 5,359,468 | A | * 10/1994 | Rhodes | G11B 20/10 360/32 |
| 8,898,548 | B1 | * 11/2014 | Mullendore | H03M 13/353 365/185.09 |
| 2006/0080515 | A1 | * 4/2006 | Spiers et al. | 711/162 |
| 2007/0008847 | A1 | * 1/2007 | Maruyama et al. | 369/47.14 |
| 2007/0086282 | A1 | * 4/2007 | Maruyama et al. | 369/30.07 |
| 2008/0276149 | A1 | * 11/2008 | Kong | G06F 11/1008 714/752 |
| 2010/0115376 | A1 | * 5/2010 | Shalvi | G06F 11/1068 714/763 |
| 2011/0283054 | A1 | 11/2011 | Kozakai et al. | |
| 2012/0159281 | A1 | * 6/2012 | Shalvi | G06F 11/1044 714/755 |
| 2012/0317463 | A1 | * 12/2012 | Sugahara et al. | 714/785 |
| 2014/0258805 | A1 | * 9/2014 | Casado et al. | 714/758 |

* cited by examiner

*Primary Examiner* — Albert Decady
*Assistant Examiner* — Kyle Vallecillo
(74) *Attorney, Agent, or Firm* — Yiding Wu; Haynes Beffel & Wolfeld LLP

(57) ABSTRACT

A method for operating a memory includes receiving an input data set, saving a first level error correcting code ECC for the data in the input data set, saving second level ECCs for a plurality of second level groups of the data in the data set, storing the data set in the memory, and testing the data set to determine whether to use the first level ECC or the second level ECCs. The method includes, if the first level ECC is used, storing a flag enabling use of the first level ECC, else if the second level ECCs are used, storing a flag enabling use of the second level ECCs. The method includes storing the second level ECCs in a replacement ECC memory, and storing a pointer indicating locations of the second level ECCs in the replacement ECC memory.

18 Claims, 8 Drawing Sheets

| ECC Levels as Indicated by Flags | | | Flags |
|---|---|---|---|
| 30-bit ECC per page | | | 00 |
| 30-bit ECC per page | | | 00 |
| 30-bit ECC per page | | | 00 |
| 30-bit ECC per page | | | 00 |
| 30-bit ECC per ½ page | | 30-bit ECC per ½ page | 01 |
| 30-bit ECC per page | | | 00 |
| 30-bit ECC / ¼ page | 30-bit ECC / ¼ page | 30-bit ECC / ½ page | 10 |
| 30-bit ECC per page | | | 00 |

Figure 3

DYNAMIC DATA DENSITY ECC

BACKGROUND

Field of the Invention

The present invention relates to memory devices and systems including error correction code (ECC) logic.

Description of Related Art

Memory technologies used for integrated circuit memories are being developed at smaller and smaller technology nodes, and are being deployed on larger and larger memory arrays on a single integrated circuit. As the technology for memory cells advances, the margins for sensing the data can become tighter. Also, the ability of the memory cells to hold data values in the presence of disturbance of the memory cell state caused by high speed and high volume accesses to the memory cells and to neighboring memory cells can be limited by the tighter margins.

To address issues like those that arise from tighter margins and memory cell disturbance, as these technologies scale in size and density, use of error correcting codes (ECCs) embedded with integrated circuit memory has been developed. However, each memory has limited resources for storing error correcting codes.

Thus, it is desirable to provide a method that efficiently utilizes limited resources available in a memory for ECCs.

SUMMARY

A method for operating a memory includes receiving an input data set, saving a first level error correcting code ECC for the data in the input data set, saving second level ECCs for a plurality of second level groups of the data in the data set, storing the data set in the memory, and testing the data set to determine whether to use the first level ECC or the second level ECCs. As a result, the amount of ECC resources applied for a given data set can be dynamically determined based on testing after the data set is stored. The first level ECC and the second level ECCs can be computed by a processor coupled to the memory before the first level ECC and the second level ECCs are saved in the memory.

The first level ECC and the second level ECCs can be sized in terms of numbers of ECC bits, so that the second level ECCs in combination have more capability to detect and correct errors in the data set than does the first level ECC alone. For example, the first level ECCs and the second level ECCs can have the same size.

If the first level ECC is used, a flag enabling use of the first level ECC can be stored, else if the second level ECCs are used, a flag enabling use of the second level ECCs can be stored. The second level ECCs can be stored in a replacement ECC memory, and a pointer indicating locations of the second level ECCs in the replacement ECC memory can be stored, where the replacement ECC memory stores second level ECCs for other data sets stored in the memory.

Testing the data set can include determining to use the first level ECC if a failed bit count for the data in the input data set is less than a first threshold.

More than two levels of ECC can be utilized. For example, the method can include saving third level ECCs for a plurality of third level groups of the data in the data set, where the third level groups consist of a smaller number of bits than the second level groups. The method in the three level case can include using the first level ECC if a failed bit count for the data in the input data set is less than a first threshold, using the second level ECCs if the failed bit count for the data in the input data set is greater than or equal to the first threshold and less than a second threshold, and using third level ECCs if the failed bit count for the data in the input data set is greater than or equal to the second threshold and less than a third threshold. The third level ECCs can be computed by a processor coupled to the memory before the third level ECCs are saved in the memory.

A memory device and a processor configured to execute the methods described herein are also described.

Other aspects and advantages of the present invention can be seen on review of the drawings, the detailed description and the claims, which follow.

BRIEF DESCRIPTION OF THE DRAWINGS

FIG. 3 illustrates an example of how a flag indicates whether to use first level ECC over a data set or a plurality of ECCs over a plurality of respective groups of the data in the data set.

DETAILED DESCRIPTION

Figure 1:
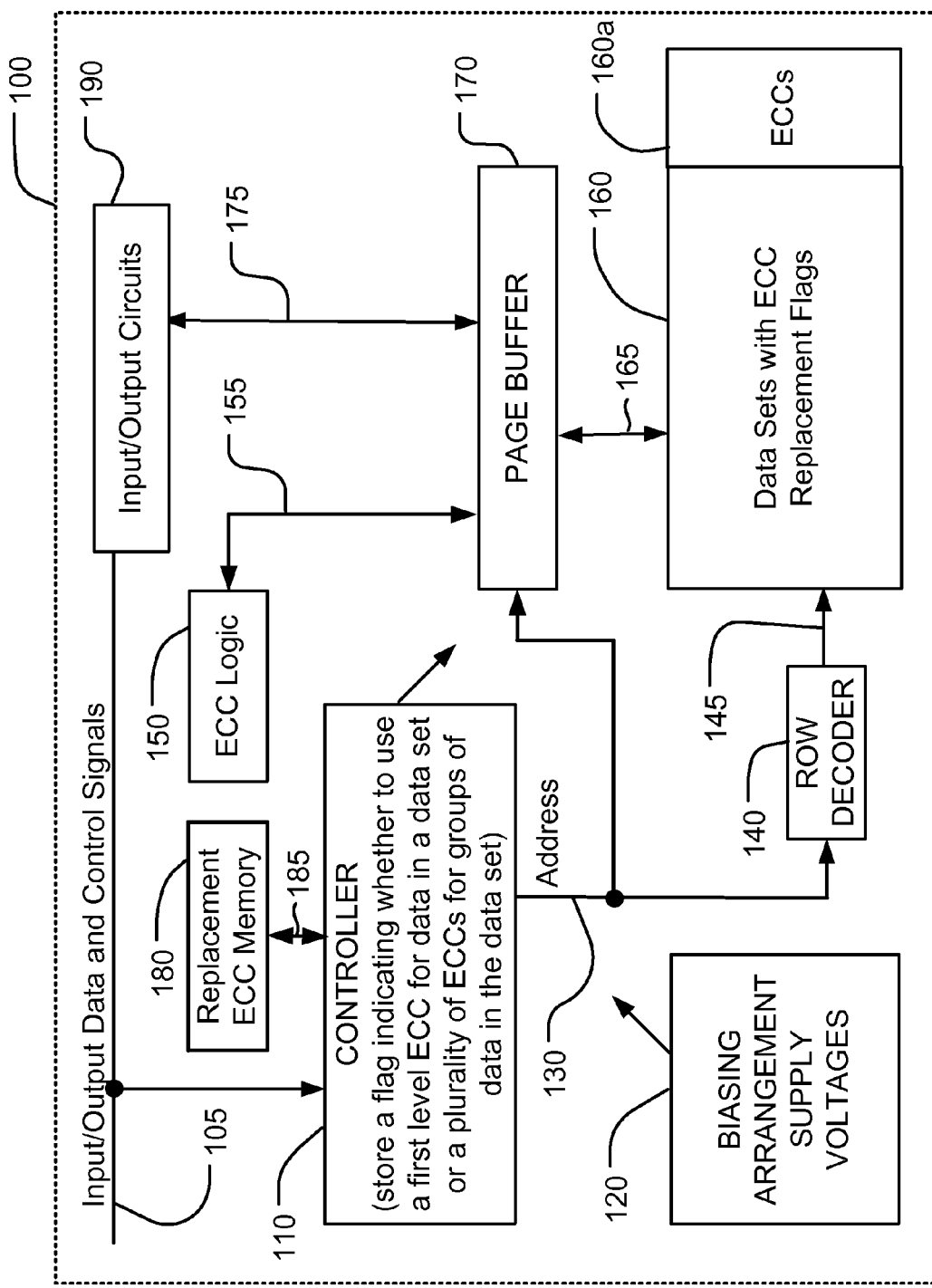
FIG. 1 is a simplified chip block diagram of a device including a memory according to an embodiment.

A detailed description of various embodiments is described with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a simplified chip block diagram of a device including a memory according to an embodiment. In the example illustrated in FIG. 1, a device 100 includes a memory 160 storing a plurality of data sets. The plurality of data sets includes at least one data set with a first level ECC over the data set, and at least one other data set with a plurality of ECCs over a plurality of respective groups of the data in the data set. Data sets in the plurality of data sets can have an equal size. Memory 160 stores the first level ECC in memory 160a logically associated with an address for the corresponding data set.

A device (e.g. 100) including a memory (e.g. 160) can utilize an address translation table to translate logical addresses used by a host such as a processor (e.g. 810, FIG.

8) to physical addresses used by the memory. For instance, logical addresses 0x0010, 0x0011, 0x0012 and 0x0013 can be translated to physical addresses 0x0AAA, 0x0123, 0x0456 and 0x1000, respectively, where '0x' indicates hexadecimal values. Thus a physical address for a data set in the memory is translated from a logical address according to the translation table. Furthermore, the logical to physical mapping in the translation table for a data set can change as determined by the host for performing memory management functions including bad block management, re-mapping, refreshing, and wear leveling.

The first level ECC can be stored in memory 160a logically associated with an address for the corresponding data set in the sense that the first level ECC has the same logical address as the logical address for the corresponding data set, and if the logical to physical mapping changes for the data set, then the same change applies to the first level ECC for the data set. For instance, logical address 0x0010 for a data set can be first translated to 0x0AAA, and then be changed to 0x0BBB for purposes of performing memory management functions, while both the data set and the first level ECC can be addressed via the logical address 0x0010 before and after the change.

Figure 2:
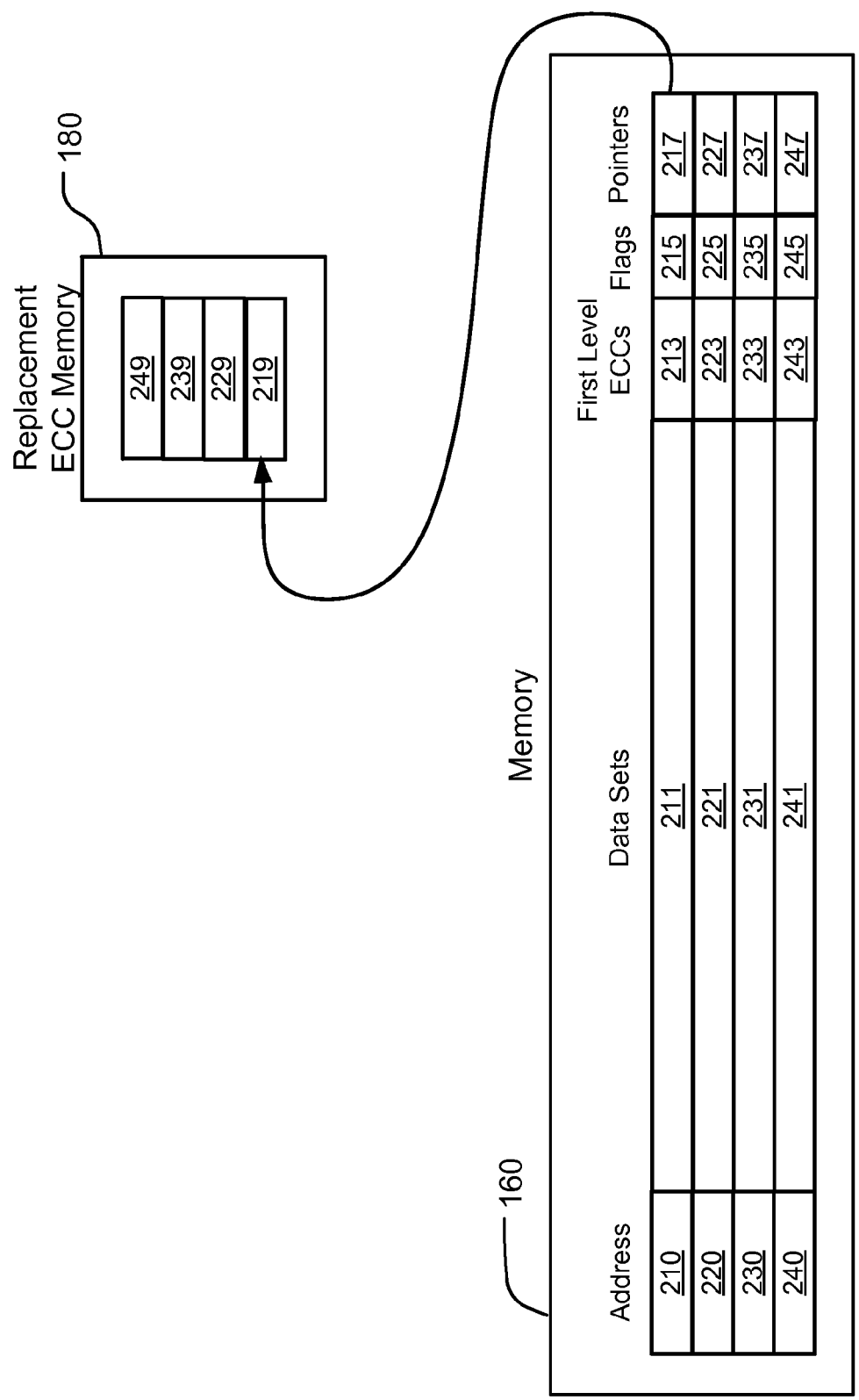
FIG. 2 is a more detailed view of the memory and replacement ECC memory in FIG. 1.

ECC replacement flags (e.g. 215, 225, 235, 245) and pointers (e.g. 217, 227, 237, 247) for corresponding data sets, as described in connection with FIG. 2, are also logically associated with the addresses for the data sets, in the same sense as for the first level ECCs.

Memory 160 stores a flag and a pointer in memory logically associated with an address for a corresponding data set, and stores the plurality of ECCs (a.k.a. replacement ECCs) in a replacement ECC memory 180. The flag indicates whether to use the first level ECC or the plurality of ECCs, and the pointer indicates locations of the plurality of ECCs in the replacement ECC memory 180. The replacement ECC memory 180 stores pluralities of ECCs for other data sets stored in memory 160. The first level ECC stored in memory 160 and each ECC in the plurality of ECCs stored in replacement ECC memory 180 can have an equal length in some embodiments.

In one implementation, the device 100 can have one replacement ECC memory for pages on each word line. For example, there can be 64 pages on each word line. The replacement ECC memory for pages each word line can include a number of segments, such as 4 or 8 segments. Thus the 64 pages on each word line share the number of segments in the replacement ECC memory. Each segment can store 2, 4 or 8 replacement ECCs for a page on the word line. The pointer that indicates locations of the replacement ECCs in the replacement ECC memory can refer to each particular segment in the number of segments. For instance, for a replacement ECC memory including 4 segments, the pointer can have values of '00', '01', '10', and '11' to refer to first, second, third and fourth segments in the replacement ECC memory. By having a replacement ECC memory for each word line, the pointer only needs to have two bits for 4 segments per page, to efficiently utilize the limited resources in the memory. In comparison, if the device 100 has a general replacement ECC memory for all pages in the memory, then the pointer for each page needs more bits to indicate locations of replacement ECCs in the general replacement ECC memory.

In the example shown in FIG. 1, a controller 110 using a bias arrangement state machine controls the application of bias arrangement supply voltage generated or provided through the voltage supply or supplies in block 120, such as read and program voltages. The controller 110 is coupled to page buffer 170, ECC logic 150, and the memory 160. The ECC logic 150 is coupled to the page buffer 170 via signals 155.

The controller 110 includes logic to receive an input data set via the input/output circuits 190, to store the data set in the memory 160, and to store the flag indicating whether to use a first level ECC for the data in the input data set or a plurality of ECCs over a plurality of respective groups of the data in the data set. The controller 110 further includes logic to store the plurality of ECCs in the replacement ECC memory 180, and logic to store the pointer indicating locations of the plurality of ECCs in the replacement ECC memory 180.

The controller 110 also includes logic to read the data set, a flag for the data set indicating whether to use the first level ECC or the plurality of ECCs for the data set, the first level ECC, and the plurality of ECCs. If the first level ECC is indicated by the flag, the ECC logic is executed using the first level ECC on the data set. If the plurality of ECCs is indicated by the flag, the ECC logic is executed using the plurality of ECCs on the data set.

The controller 110 can be implemented using special-purpose logic circuitry as known in the art. In alternative embodiments, the control logic includes a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

In the example shown in FIG. 1, a row decoder 140 is coupled to a plurality of word lines 145, and arranged along rows in the memory 160. The page buffer 170 is coupled to a plurality of bit lines 165 arranged along columns in the memory 160 for reading data from and writing data to the memory 160. Addresses are supplied on bus 130 from controller 110 to the page buffer, and the row decoder. The page buffer can include a column decoder coupled to the memory 160 and the bus 130, and sense amplifiers for read operations and a program buffer for program operations coupled to the column decoder. The page buffer is coupled to input/output circuits 190, in this example via a data bus 175. Input/output circuits 190 drive the data to destinations external to the device 100. Input/output data and control signals are moved via data bus 105 between the input/output circuits, the controller 110 and input/output ports on the device 100 or other data sources internal or external to the device 100, such as a general purpose processor or special purpose application circuitry, or a combination of modules providing system-on-a-chip functionality supported by the memory 160.

FIG. 2 is a more detailed view of the memory and replacement ECC memory in FIG. 1. In the example shown in FIG. 2, memory 160 stores a plurality of data sets (e.g. 211, 221, 231, 241) logically associated with addresses (e.g. 210, 220, 230, 240) for the plurality of data sets. Memory 160 stores first level ECCs (e.g. 213, 223, 233, 243) in memory logically associated with the addresses for the plurality of data sets.

Memory 160 also stores flags (e.g. 215, 225, 235, 245) and pointers (e.g. 217, 227, 237, 247) logically associated with the addresses for the plurality of data sets. The replacement ECC memory 180 can store a plurality of ECCs over a plurality of respective groups of the data in a data set. The memory 160 can include entries that are addressed by a part of the address of the data set, such as the page address or a block address, and the pointer. The flags indicate whether to use the first level ECC or the plurality of ECCs. The pointers indicate locations of the plurality of ECCs in the replacement ECC memory. For instance, flag 215 can indicate that data set 211 logically associated with address 210 is used with a plurality of ECCs, and that pointer 217 indicates a location 219 in the replacement ECC memory 180 where the plurality of ECCs is stored for the data set 211. For instance, flag 225 can indicate that data set 221 logically associated with address 220 is used with first level ECC 223, so the replacement ECC memory 180 and pointer 227 are not needed for data set 221.

FIG. 3 illustrates an example of how a flag indicates whether to use a first level ECC over a data set or a plurality of ECCs over a plurality of respective groups of the data in the data set. In the example shown in FIG. 2, a flag has a two-bit value including '00', '01', and '10'. A page of data is used as an example of the data in a data set. A value of '00' for the flag indicates that the page is used with a 30-bit first level ECC. A value of '01' for the flag indicates that the page is used with two 30-bit second level ECCs, one for a half of the page. A value of '10' for the flag indicates that the page is used with four 30-bit third level ECCs, one for a quarter of the page. The 30-bit first level ECC, each ECC in the two 30-bit second level ECCs, and each ECC in the four 30-bit third level ECCs have an equal length.

Figure 4:
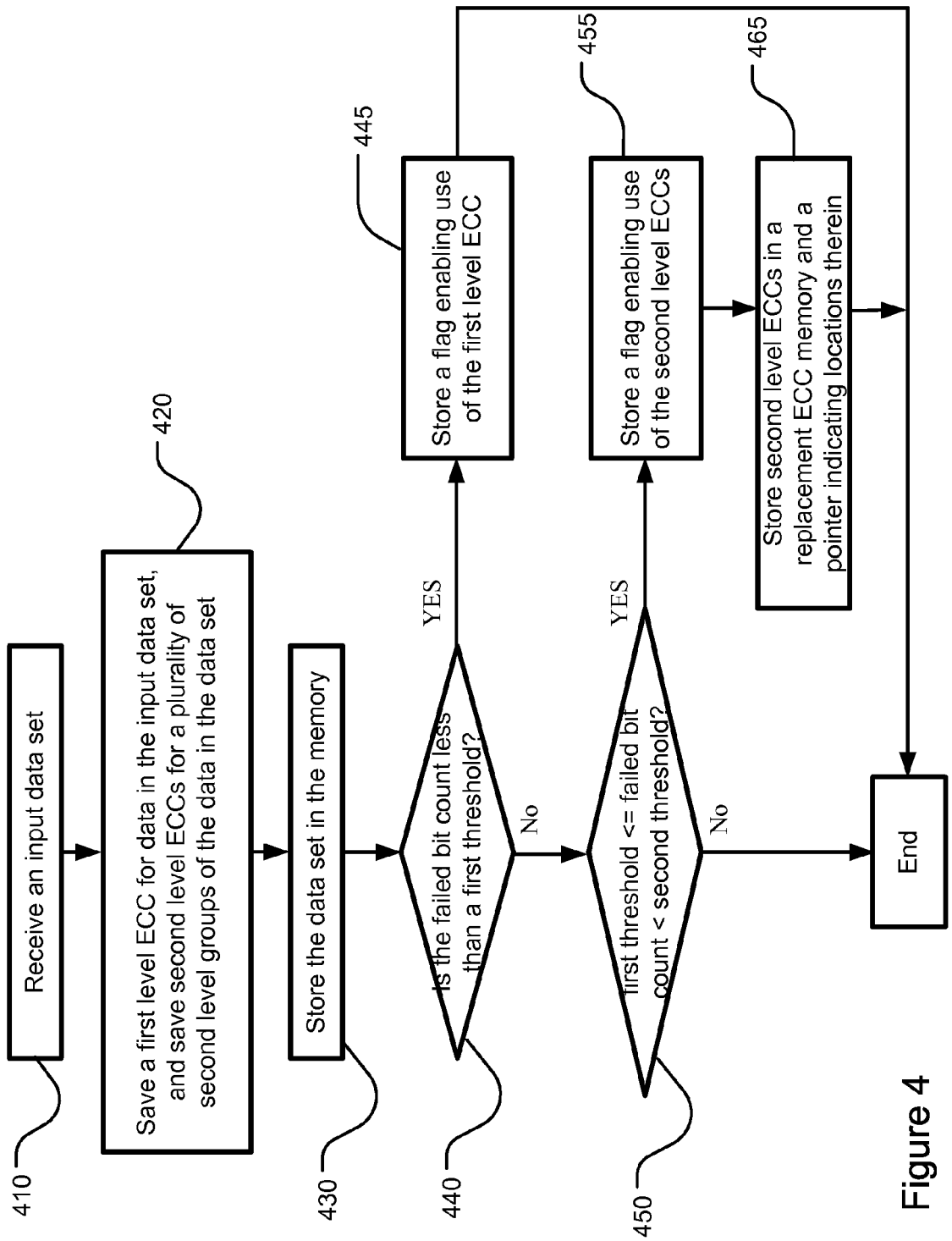
FIG. 4 is an example flow chart for storing data with ECC replacement flags according to an embodiment.

FIG. 4 is an example flow chart for storing data with ECC replacement flags according to an embodiment. The order of steps is provided as one example. The steps can be executed in other orders, and in parallel in some cases. The method described below for storing data can be executed by the controller 110 in device 100 as shown in FIG. 1, in conjunction with a processor as described in connection with FIG. 8.

In the example illustrated in FIG. 4, at Step 410, an input data set is received. At Step 420, a first level error correcting code ECC for the data in the input data set can be saved, and second level ECCs for a plurality of second level groups of the data in the data set can be saved. More than two levels can be used. For instance, third level ECCs for a plurality of third level groups of the data in the data set can also be saved. The first level ECC, the second level ECCs, and the third level ECCs can be computed by a processor coupled to the memory where the first level ECC, the second level ECCs, and the third level ECCs are saved in the memory. At Step 430, the data set can be stored in the memory. Storing the data set can include a program operation and a verify operation for each bit of the data in the data set. A bit of data that fails the verify operation is counted as a failed bit. A failed bit count for the data in the data set can be used to determine which level ECCs to use, such as whether to use the first level ECC, the second level ECCs, or the third level ECCs.

At Step 440, it is determined whether a failed bit count for the data set is less than a first threshold. If the failed bit count for the data set is less than the first threshold, a flag can be stored to enable use of the first level ECC (Step 445). If the failed bit count for the data set is not less than the first threshold, it is determined whether the failed bit count for the data set is greater than or equal to the first threshold and less than a second threshold (Step 450). If so, a flag can be stored to enable use of the second level ECCs (Step 455). If not, and if third level ECCs are computed and saved, it can be further determined whether the failed bit count for the data set is greater than or equal to the second threshold and less than a third threshold. An example of how a flag indicates whether to use the first level ECC over a data set or the second level ECCs over a plurality of respective groups of the data in the data set is described in connection to FIG. 3.

If the failed bit count for the data set is greater than or equal to the first threshold and less than the second threshold (Step 450), the second level ECCs can be stored in a replacement ECC memory (e.g. 180, FIG. 2), and a pointer (e.g. 217, FIG. 2) indicating locations of the second level ECCs in the replacement ECC memory can be stored in memory logically associated with an address for the corresponding data set (Step 465).

If the failed bit count for the data set is greater than or equal to the second threshold and less than the third threshold, the third level ECCs can be stored in the replacement ECC memory (e.g. 180, FIG. 2), and a pointer (e.g. 217, FIG. 2) indicating locations of the third level ECCs in the replacement ECC memory can be stored in memory logically associated with an address for the corresponding data set.

The second threshold is greater than the first threshold, and the third threshold is greater than the second threshold. The first, second and third thresholds can be pre-determined for a page of data having a particular size. For instance, for a page of data having 1 kilo bytes, the first, second, and third thresholds can be pre-determined to be 25, 30, and 40 failed bits, respectively.

If it is determined that the failed bit count for the data set is greater than a maximum threshold (e.g. 40 failed bits) such that the data set cannot be corrected with ECCs, or if the replacement ECC memory (e.g. 180, FIG. 2) is full so cannot store more replacement ECCs (e.g. second level ECCs), then the data set can be marked as a failed data set so the data set can then be repaired using techniques including memory redundancy techniques. Further description about the maximum threshold is provided in connection with FIGS. 6 and 7.

Figure 5:
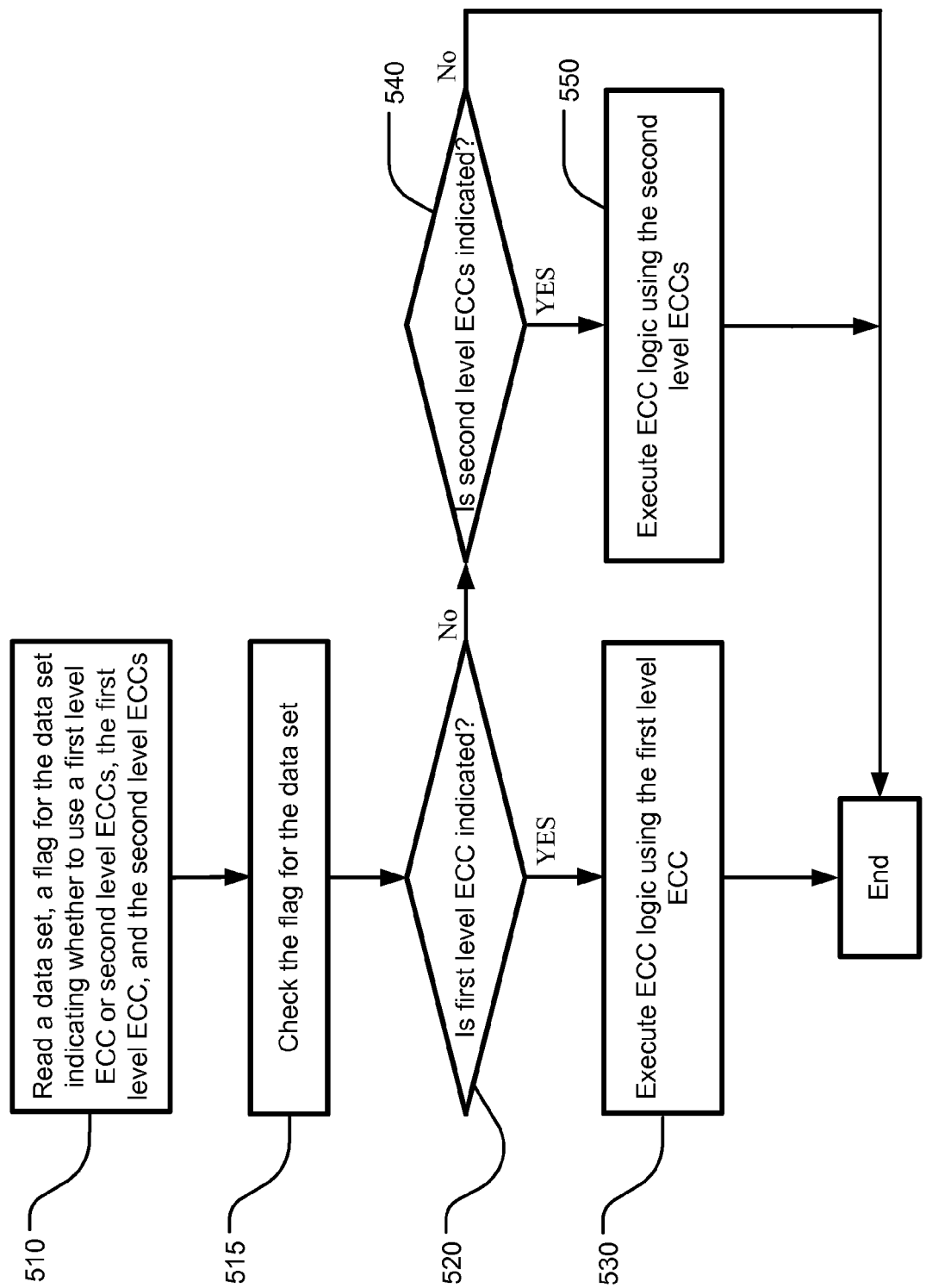
FIG. 5 is an example flow chart for reading data stored with ECC replacement flags.

FIG. 5 is an example flow chart for reading data stored with ECC replacement flags. In the example illustrated in FIG. 5, at Step 510, a data set and a flag for the data set are read, where the flag indicates whether to use a first level error correcting code ECC over the data set or second level ECCs over a plurality of respective groups of the data in the data set. At Step 510, the first level ECC and the second level ECCs are also read. At Step 515, the flag is checked for the data set. If it is determined that the first level ECC is indicated (YES, 520), then ECC logic is executed using the first level ECC on the data set (Step 530). If it is determined that the second level ECCs are indicated (YES, 540), then ECC logic is executed using the second level ECCs on the data set (Step 550). Although FIG. 5 only illustrates a first level ECC and second level ECCs over a plurality of respective groups of the data in the data set, more than two levels can be used. For instance, third level ECCs are described in connection with FIG. 3. The ECC replacement flags can indicate whether to use more than two levels including third level ECCs. For example, a flag value of 10 indicates that third level ECCs are used, as shown in FIG. 3. The method as described for reading data can be executed by the controller 110 in device 100 as shown in FIG. 1.

For reading data stored with ECC replacement flags (e.g. second level ECCs), the ECC logic can be executed to apply a sequence of actions to each group in a plurality of second level groups of the data in the data set. The ECC logic can first be executed to apply a first action in the sequence to a group of data in the plurality of second level groups of data. The ECC logic can then be executed to apply a subsequent second action in the sequence to the group of data, while at a same time executing the ECC logic can then be executed to apply the first action to another group of data in the plurality of second level groups of data.

In one implementation, the sequence of actions includes actions referred to as syndrome, key, and Chien search. The syndrome action computes a syndrome (e.g. a polynomial) that indicates whether the data that on which the ECC logic acts is error-free, or which bit in the data is in error. The key action uses the syndrome as input, and outputs a key (e.g. an error locator polynomial). The Chien search then uses the key as input and outputs error locations.

In one example, the plurality of second level groups of data includes two groups of the data in the data set, where each of the two groups includes an equal half of the data in the data set. The ECC logic can first be executed to apply a first action to generate a syndrome for a group including half of the data in the data set. The ECC logic can then be executed to apply a subsequent second action to generate a key from the syndrome for the group of data, while at a same time the ECC logic can be executed to apply the first action to generate a syndrome for another group including other half of the data in the data set.

Accordingly, different actions in the sequence can be applied in parallel to different groups of data in the plurality of second level groups of data in the data set, minimizing time required for executing the ECC logic on different groups of data in the data set and essentially not impacting the reading speed of the memory.

Figure 6:
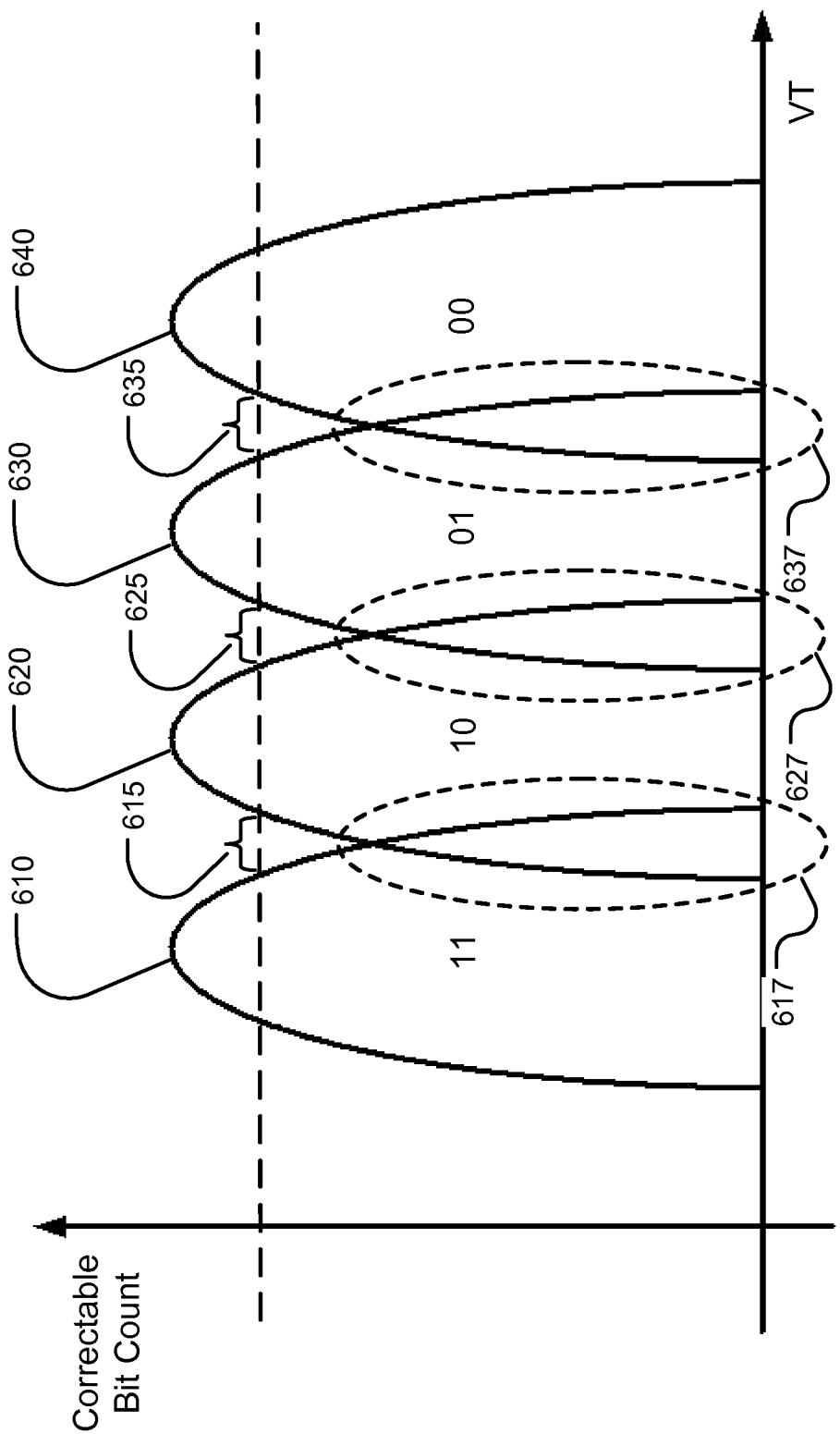
FIG. 6 is a graph of bit count versus threshold voltage showing threshold voltage distributions for two-bit memory cells in multiple pages in a memory.

FIG. 6 is a graph of bit count versus threshold voltage showing threshold voltage distributions ($V_T$) for two-bit memory cells in multiple pages in a memory. For a two-bit memory cell, the memory is designed to detect data when the threshold voltages of the memory cells in the memory fall within four threshold voltage ranges. As illustrated in the example of FIG. 6, for a two-bit cell with four data values 11, 10, 00 and 01, a sensing window 615 is between $V_T$ distributions 610 and 620 for two adjacent data values 11 and 10. Likewise, a sensing window 625 is between $V_T$ distributions 620 and 630 for two adjacent data values 10 and 01, and a sensing window 635 is between $V_T$ distributions 630 and 640 for two adjacent data values 01 and 00.

$V_T$ distributions can vary from page to page in a memory, due to reasons including distribution with different bit counts, distribution with different program pattern, distribution with different process tail bits, and distribution with different random telegraph noise. Consequently, adjacent combined $V_T$ distributions for multiple pages in the memory can overlap. For instance, a $V_T$ distribution for one data value may overlap with a $V_T$ distribution for another data value. As illustrated in the example of FIG. 6, a $V_T$ distribution for data value 11 overlaps with a $V_T$ distribution for data value 10 (617), a $V_T$ distribution for data value 10 overlaps with a $V_T$ distribution for data value 01 (627), and a $V_T$ distribution for data value 01 overlaps with a threshold voltage ($V_T$) distribution for data value 00 (637).

If a single length of ECC is determined for multiple pages in the memory based on threshold voltage ranges corresponding to $V_T$ distributions for multiple pages in the memory that exhibits such overlapping between adjacent $V_T$ distributions, the single length of ECC can be unnecessarily long for some pages in the memory with relatively wide sensing margins, while still insufficient for other pages in the memory with relatively narrow sensing windows.

This single length of ECC can be defined as the maximum length of ECC for a page in the memory. The maximum length of ECC corresponds to a maximum number of failed bits that can be corrected within a page. For instance, if the maximum length of ECC is 40 bits, then a maximum number of 40 bits can be corrected.

Figure 7:
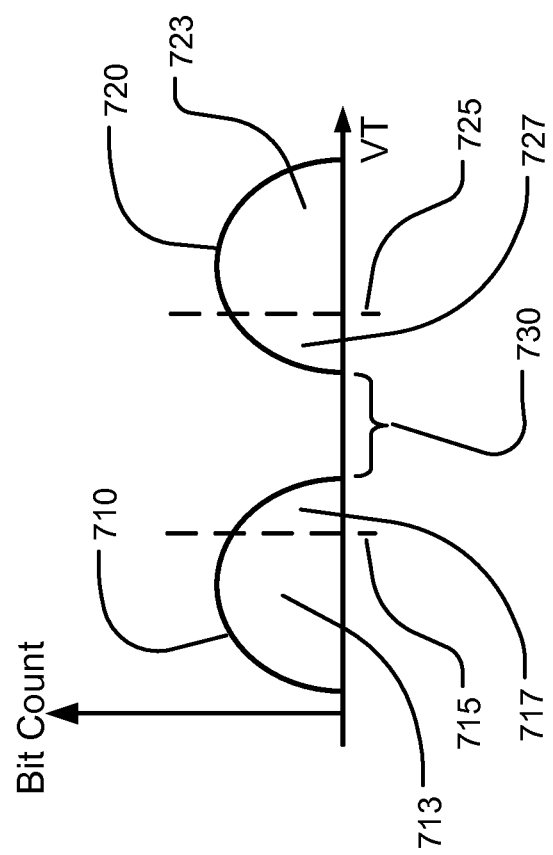
FIG. 7 illustrates a sensing window between threshold voltage ranges for two data values in memory cells in a target page.

FIG. 7 illustrates a sensing window between threshold voltage ranges for two data values in memory cells in a target page. As illustrated in the example of FIG. 7, for a two-bit cell with four data values 11, 10, 00 and 01, a sensing window 730 is between two threshold voltage ranges 710 and 720 for two adjacent data values. For instance, the two adjacent data values can be 11 and 10, 10 and 00, or 00 and 01. Data in memory cells having threshold voltages 713 below a low boundary 715 in the threshold voltage range 710 or data in memory cells having threshold voltages 723 above a high boundary 725 in the threshold voltage range 720 are less likely to experience errors or require ECC correction. Data in memory cells having threshold voltages 717 above the low boundary 715 in the threshold voltage range 710 or data in memory cells having threshold voltages 727 below the high boundary 725 in the threshold voltage range 720 are more likely to experience errors or require ECC correction. Data errors in memory cells in the target page, including those having threshold voltages 717 and 727, may be correctable with the first level ECC or the second level ECCs, depending on how wide the sensing window 730 is for the target page.

When the length of ECC is determined for each target page, where sensing windows for each target page can be wider than those for multiple pages in a memory, such length of ECC can be shorter than the maximum length of ECC described in connection with FIG. 6. For instance, if the maximum length of ECC is 40 bits for multiple pages of data in a memory, then a shorter length, such as 30 bits, can be used for each target page, a half of the target page, or a quarter of the target page, as shown in FIG. 3.

Figure 8:
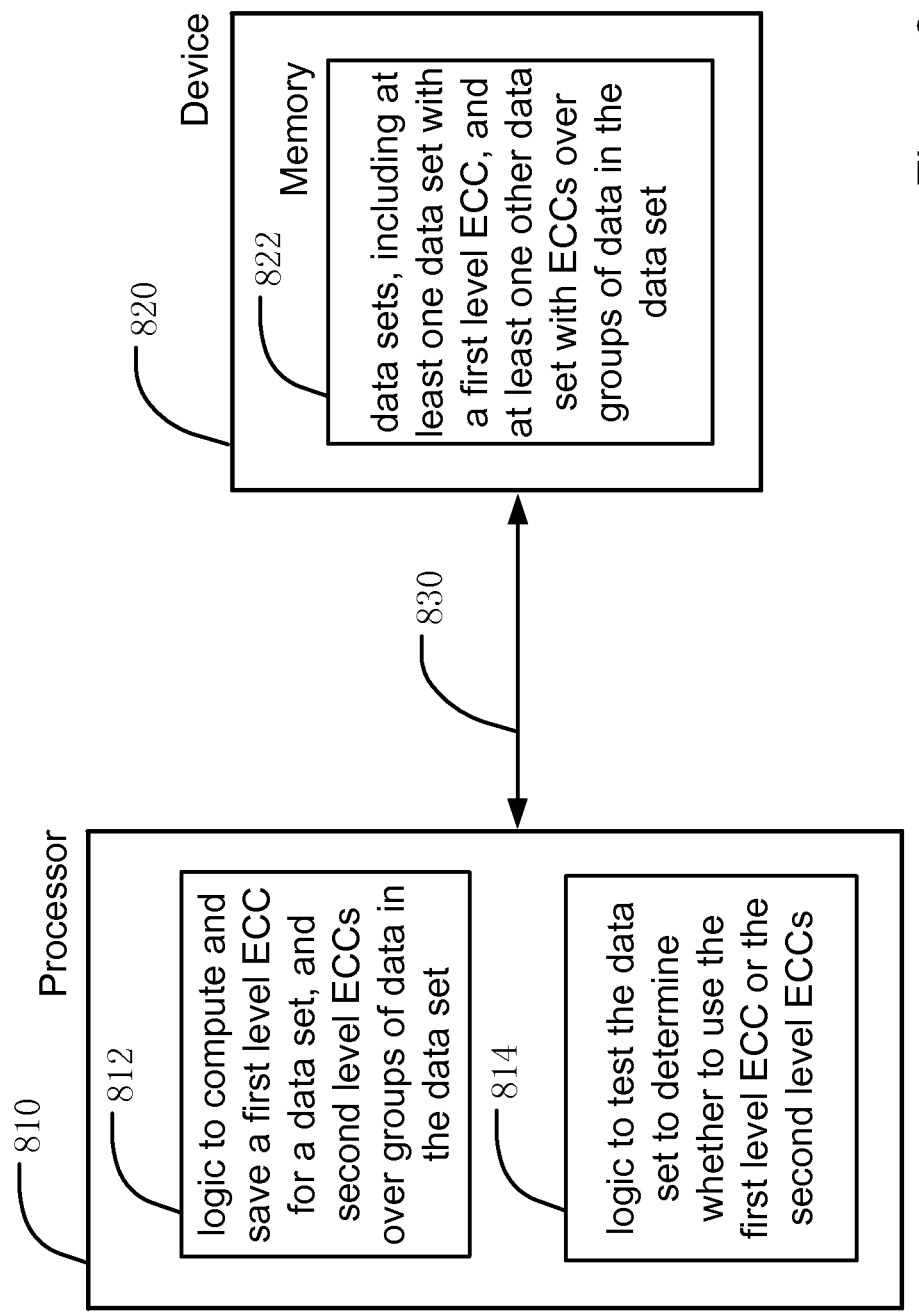
FIG. 8 is a diagram illustrating a processor coupled to a device as described herein and configured to execute the methods as described herein.

FIG. 8 is a diagram illustrating a processor coupled to a device as described herein and configured to execute the methods as described herein. In one implementation, a processor 810 can include logic 812 to compute and save a first level ECC for data in a data set, and to compute and save second level ECCs for a plurality of second level groups of the data in the data set. The processor can include logic 814 to test the data set to determine whether to use the first level ECC or the second level ECCs. The processor 810 is coupled to a device 820. The device 820 includes a memory 822 that can store a plurality of data set, including at least one data set with a first level ECC, and at least one other data set with a plurality of ECCs over a plurality of respective groups of the data in the data set. Data sets in the plurality of data sets can have an equal size. The processor 810 and the device 820 are coupled via signals 830 such that the first level ECC, the plurality of ECCs, and a flag indicating whether to use the first level ECC or the plurality of ECCs can be transmitted from the processor to the device, and information including failed bits in a data set can be transmitted from the device to the processor.

The logic to test the data set can include logic to determine to use the first level ECC if a failed bit count for the data in the input data set is less than a first threshold, and logic to use the second level ECCs if the failed bit count for the data in the input data set is greater than or equal to the first threshold and less than a second threshold. The processor can include further logic to compute and save third level ECCs for a plurality of third level groups of the data in the data set. The logic to test the data set can include logic to determine to use third level ECCs if the failed bit count for the data in the input data set is greater than or equal to the second threshold and less than a third threshold.

The processor can use the method described herein with multiple data sets, where the multiple data sets can include pages of data on one or more word lines, or all pages of data in a memory in a device. In one implementation, the processor can first compute and save the first level ECCs for data in the multiple data sets, and pluralities of ECCs over pluralities of respective groups of the data in the multiple data sets, and then for each data set in the multiple data sets, test the data set to determine whether to use the first level ECC or the plurality of ECCs. In an alternative implementation, the processor can, on per data set basis, test the data set to determine whether to use the first level ECC or the plurality of ECCs, and then compute and save the first level ECC for data in the data set, or the plurality of ECCs over a plurality of respective groups of the data in the data set.

As described herein, the first level ECC and each ECC in the second level ECCs can have an equal length. By one estimation using 131,072 pages, where a page has 512 bytes or 4096 bits, if the equal length is 30 bits, then errors in 99.99% of the pages can be detected and corrected with first level ECCs having 30 bits each, while errors in the rest 0.01% of the pages can be detected and corrected with second level ECCs. In comparison, if the equal length is reduced to 20 bits, then errors in 95% of the pages can be detected and corrected with first level ECCs having 20 bits each, while errors in the rest 5% of the pages can be corrected with second level ECCs. Accordingly, by storing two replacement 20-bit ECCs (e.g. second level ECCs) per page for 5% of the pages, the first level ECC bits for 95% of the pages are reduced by 10 bits per page, or by a factor of about 9. This analysis can be used to specify the size of the replacement ECC memory needed of a given implementation.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a memory, comprising:
   receiving an input data set;
   saving a first error correcting code (ECC) for the input data set, and saving a plurality of second ECCs for the input data set, each of the second ECCs configured for use with a corresponding group of data in the input data set;
   storing the input data set in the memory;
   testing the input data set to determine whether to use the first ECC or the second ECCs;
   if it is determined to use the plurality of second ECCs, then storing the plurality of second ECCs and a pointer logically associated with an address for the input data set in the memory indicating locations of second ECCs in the plurality of second ECCs; and
   executing ECC logic using the second ECCs, wherein the ECC logic applies a sequence of actions to groups of data in the input data set, including applying a first action in the sequence to a group of data in the groups of data in the input data set to generate a first result; and applying a subsequent second action in the sequence to generate a second result from the first result, while at a same time executing the ECC logic to apply the first action to another group of data in the groups of data in the input data set.

2. The method of claim 1, comprising:
   computing the first ECC before said saving the first ECC; and
   computing the second ECCs before said saving the second ECCs.

3. The method of claim 1, wherein said testing the data set includes:
   determining to use the first ECC if a failed bit count for the data in the input data set is less than a first threshold.

4. The method of claim 1, comprising:
   computing a plurality of third ECCs for the data set, each of the third ECCs configured for use with a corresponding group of data in the data set; and
   saving the third ECCs.

5. The method of claim 4, wherein said testing the data set includes:
   determining to use the first ECC if a failed bit count for the data in the input data set is less than a first threshold;
   determining to use the second ECCs if the failed bit count for the data in the input data set is greater than or equal to the first threshold and less than a second threshold; and
   determining to use the third ECCs if the failed bit count for the data in the input data set is greater than or equal to the second threshold and less than a third threshold; and
   if it is determined to use the third ECCs, then storing the plurality of third ECCs and a pointer logically associated with an address for the input data set in the memory indicating locations of third ECCs in the plurality of third ECCs.

6. The method of claim 1, comprising:
   if it is determined to use the first ECC, storing a flag enabling use of the first ECC,
   else if it is determined to use the second ECCs, storing a flag enabling use of the second ECCs.

7. The method of claim 1, wherein the first ECC and each second ECC in the plurality of second ECCs have an equal length.

8. A method of operating a memory, comprising:
   reading, in response to an address for a data set stored in a particular row of a memory array, the data set, a flag and a pointer for the data set indicating whether to use a first error correcting code (ECC) over the data set or a plurality of second ECCs for the data set, wherein each of the second ECCs is configured for use with a corresponding group of data in the data set;
   if use of the first ECC is indicated, executing ECC logic using the first ECC on the data set; and
   if use of the second ECCs is indicated, reading the plurality of second ECCs using the pointer, and executing the ECC logic using the second ECCs on the data set;
   wherein the first ECC is stored in the memory array, and the second ECCs are stored in memory identified by the pointer logically associated with the address for the data set indicating locations of second ECCs in the plurality of second ECCs, wherein the ECC logic applies a sequence of actions to groups of data in the data set, including applying a first action in the sequence to a group of data in the groups of data in the data set to generate a first result; and
   applying a subsequent second action in the sequence to generate a second result from the first result, while at a same time executing the ECC logic to apply the first action to another group of data in the groups of data in the data set.

9. A device, comprising:

a memory on an integrated circuit storing a plurality of data sets, including at least one data set with a first error correcting code (ECC) over the data set, and at least one other data set with a plurality of second ECCs for the data set, each of the second ECCs in the plurality configured for use with a corresponding group of data in the one other data set, wherein data sets in the plurality of data sets have an equal size; and a controller coupled to the memory;

wherein the first ECC is stored in the memory array, and second ECCs in the plurality of second ECCs are stored in memory identified by a pointer logically associated with an address for a corresponding data set indicating locations of second ECCs in the plurality of second ECCs, wherein the controller includes:

logic to receive an input data set; and logic to, if use of the plurality of second ECCs is indicated, read the plurality of second ECCs and execute ECC logic using the plurality of second ECCs on the input data set;

wherein the ECC logic applies a sequence of actions to groups of data in the data set, including applying a first action in the sequence to a group of data in the groups of data in the data set to generate a first result; and applying a subsequent second action in the sequence to generate a second result from the first result, while at a same time execute the ECC logic to apply the first action to another group of data in the groups of data in the data set.

10. The device of claim 9, wherein the memory stores a flag logically associated with an address for a corresponding data set, the flag indicates whether to use the first ECC or the plurality of second ECCs.

11. The device of claim 9, wherein the first ECC and each second ECC in the plurality of second ECCs have an equal length.

12. The device of claim 9 the controller including:

logic to store the input data set in the memory; and logic to store a flag indicating whether to use the first ECC for the input data set or the plurality of second ECCs, each of the second ECCs in the plurality configured for use with a corresponding group of data in the input data set.

13. The device of claim 12, the controller including:

logic to store the plurality of second ECCs; and logic to store a pointer logically associated with an address for the input data set in the memory indicating locations of second ECCs in the plurality of second ECCs.

14. The device of claim 12, the controller including:

logic to read the input data set, and the flag for the input data set indicating whether to use the first ECC or the plurality of second ECCs; and logic to, if use of the first ECC is indicated, execute the ECC logic using the first ECC on the input data set.

15. A processor including:

logic to compute and save a first error correcting code (ECC) for a data set, and to compute and save a plurality of second ECCs for the data set, each of the second ECCs configured for use with a corresponding group of data in the data set;

logic to test the data set to determine whether to use the first ECC or the second ECCs;

logic to execute ECC logic using the plurality of second ECCs, wherein the ECC logic applies a sequence of actions to groups of data in the data set, including applying a first action in the sequence to a group of data in the groups of data in the data set to generate a first result; and applying a subsequent second action in the sequence to generate a second result from the first result, while at a same time execute the ECC logic to apply the first action to another group of data in the groups of data in the data set, wherein the first ECC is stored in a memory array, and if it is determined to use the second ECCs, the second ECCs are stored in memory identified by a pointer logically associated with an address for the data set indicating locations of second ECCs in the plurality of second ECCs.

16. The processor of claim 15, wherein the logic to test the data set includes:

logic to determine to use the first ECC if a failed bit count for the data in the data set is less than a first threshold.

17. The processor of claim 15, including:

logic to compute and save a plurality of third ECCs, each of the third ECCs configured for use with a corresponding group of data in the data set.

18. The method of claim 1, wherein the input data set is stored in a memory array on a particular word line, the first ECC is stored in the memory array along the particular word line, and if the second ECCs are used, a pointer is stored in the memory array along the particular word line, and at least one second ECC for the input data set is stored in memory addressed using the pointer.

* * * * *